United States Patent [19]
Pitts

[11] Patent Number: 6,052,308
[45] Date of Patent: Apr. 18, 2000

[54] BALANCED SENSING ARRANGEMENT FOR FLASH EEPROM

[75] Inventor: Robert L. Pitts, Dallas, Tex.

[73] Assignee: Texas Instruments Incorporated, Dallas, Tex.

[21] Appl. No.: 09/368,054

[22] Filed: Aug. 3, 1999

Related U.S. Application Data

[60] Provisional application No. 60/096,036, Aug. 11, 1998.
[51] Int. Cl.$^7$ ................................................. G11C 16/06
[52] U.S. Cl. .......................... 365/185.21; 365/185.13; 365/185.2; 365/185.33
[58] Field of Search ..................... 365/185.21, 185.11, 365/185.13, 185.2, 185.33

[56] References Cited

U.S. PATENT DOCUMENTS 4,415,992  11/1983  Adlhoch .................................... 365/94

*Primary Examiner*—Andrew Q. Tran
*Attorney, Agent, or Firm*—Robby T. Holland; Carlton H. Hoel; Frederick J. Telecky, Jr.

[57] ABSTRACT

A balanced sensing scheme (300) for a "flash" electrically programmable and erasable read only memory (EEPROM) is disclosed. In a read operation, an upper memory cell bank (302a or 302b) and a corresponding lower memory cell bank (302c or 302d) are coupled to a sense amplifier bank (306). One of the memory cell banks provides data while the other functions as a balanced load. In the event the memory cell bank that is to function as the balanced load is in the process of being erased, an alternate memory cell bank is coupled to the sense amplifier bank (306) to provide an equivalent balanced load.

20 Claims, 4 Drawing Sheets

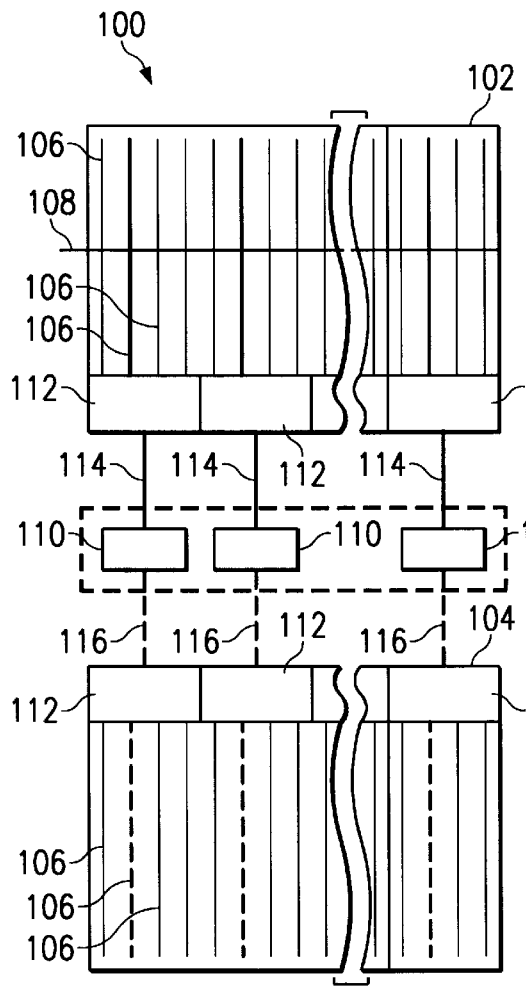
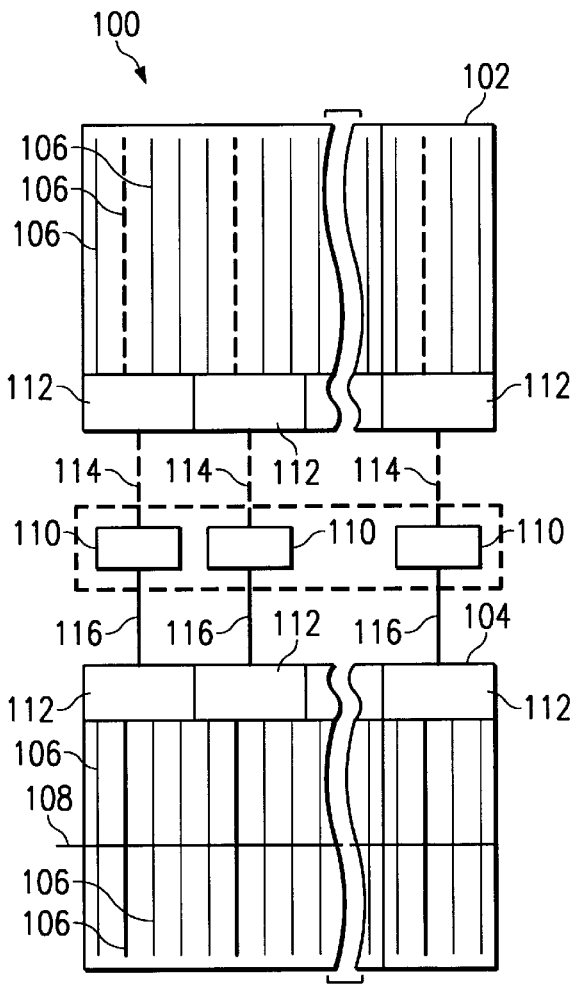
FIG. 1A
(PRIOR ART)
FIG. 1B
(PRIOR ART)

6,052,308

BALANCED SENSING ARRANGEMENT FOR FLASH EEPROM

This application claims priority under 35 USC § 119(e)(1) of provisional application No. 60/096,036 filed Aug. 11, 1998.

TECHNICAL FIELD

The present invention relates generally to semiconductor memory devices, and more particularly to the sensing of data in electrically programmable and erasable read only memories (EEPROMs) in which selected sectors can be erased while other sectors are accessed.

BACKGROUND OF THE INVENTION

Read only memories (ROMs) typically serve as a nonvolatile source of data storage. Volatile memory devices, such as dynamic random access memories (DRAMs) and static random access memories (SRAMs) can store data, but once power is removed from such devices, the data is lost. In contrast, nonvolatile memory devices, such as ROMs, electrically programmable ROMs (EPROMs), and electrically erasable and programmable ROMs (EEPROMs) retain data in the absence of power. Because of this, nonvolatile storage devices can be particularly suited for portable battery powered applications where power conservation is at a premium.

Because semiconductor memory devices include arrays of very small memory cells, the data signals provided by such memory cells are correspondingly small, and require amplification. As a result, semiconductor memory devices employ "sense" amplifiers to amplify data signals. Sense amplifiers are typically differential amplifiers that receive a data signal at one input and a reference signal at another input. A common way to increase the sensitivity with which data signals can be detected, is to take advantage of the matching physical characteristics of adjacent memory cell arrays by utilizing a "balanced" sensing arrangement.

Referring now to FIGS. 1A and 1B, a prior art balanced sensing arrangement will be described. FIG. 1A and 1B illustrate different balanced access operations for the same memory device. The memory device is designated by the general reference character 100, and is shown to include an upper array 102 and a lower array 104. Both the upper and lower arrays (102 and 104) include memory cells that are accessed by way of word lines and bit lines. Selected bit lines are indicated in the figures by the reference character 106. When a word line is activated, it places data signals from a row of memory cells onto the bit lines of its corresponding array. An activated word line is indicated in each figure by the reference character 108.

The bit lines 106 from both arrays (102 and 104) are coupled to sense amplifiers 110 by multiplexer (MUX) circuits 112. The sense amplifiers 110 are arranged in a bank between the two arrays (102 and 104). In the particular arrangement of FIG. 1, a group of four bit lines 106 is connected by one of the MUX circuits 112 to one of the sense amplifiers 110. The sense amplifiers 110 are coupled to the MUX circuits 112 of the upper array by upper data lines 114, and to MUX circuits 112 of the lower array by lower data lines 116.

A balanced sensing arrangement is achieved by providing essentially matching impedances at the two inputs of the sense amplifiers 110. In FIGS. 1A and 1B this is accomplished by activating the MUX circuits 112 of both the upper and lower arrays (102 and 104) when either the upper or lower array (102 and 104) is accessed. This is illustrated by the two figures. In FIG. 1A, the activated word line 108 is in the upper array 102. As a result, data signals from the upper array 102 are coupled to a first input of each sense amplifier 110. This operation presents an impedance at each first sense amplifier input that includes an upper data line 114 and a bit line 106 of the upper array 102. A balanced impedance for the second input of each sense amplifier 110 is provided by simultaneously enabling the MUX circuits 112 of the lower array 104. This presents an impedance at the second input of each sense amplifier 110 that includes a lower data line 116 and a bit line 106 of the lower array 104. Because a word line within the lower array is not activated, data is not present on the lower data lines 116. Instead, a reference signal is placed on lower data lines 116. Provided the lower data lines 116 are the same as the upper data lines 114, and the bit lines 106 of the upper and lower arrays are identical, the inputs to the sense amplifiers 110 will have a matching impedance. This arrangement provides for higher common noise rejection, and hence a more sensitive data sensing scheme. The two bit lines are also simultaneously biased to a fixed voltage which also improves common mode sensing.

FIG. 1B is provided to illustrate that when the lower array 104 is accessed for data, the upper array 102 can provide a balancing impedance. In such an operation, the upper data lines 114 would be coupled to a reference signal.

Balanced sensing schemes, while effective in some semiconductor memory devices, can be problematic when applied to others. In particular, balanced sensing schemes in "flash" EEPROMs can lead to operational drawbacks. Flash EEPROMs derive their name from the manner in which they are erased. In a conventional EEPROM, selected memory cells are erased individually, or in limited numbers, such as bytes. Thus, the erasure of an entire conventional EEPROM can be a lengthy process. In contrast, a flash EEPROM allows the simultaneous erasure of a large group of memory cells (sometimes referred to as "blocks," "banks" or "sectors"). To better understand the drawbacks associated with implementing balanced sensing schemes in flash EEPROMs, the operation of a typical flash EEPROM cell will be discussed.

In the typical flash EEPROM cell, the data signal is a current signal. This arises out of the fact that the flash EEPROM memory cell employs a "floating" gate. The floating gate is disposed between a control gate and a channel region to alter the threshold voltage of the resulting insulated gate field effect transistor structure. If the memory cell is programmed, the floating gate is negatively charged, and when its respective transistor is accessed, the threshold voltage of the cell will be higher than the applied control gate voltage. The cell will draw no (or negligible) current, establishing a logic "0." If the memory cell is erased, the floating gate will possess only limited negative charge, and the application of the applied control gate voltage results in channel inversion within the cell. The cell will thus draw current when accessed, thereby establishing a logic "1."

The erasing of flash EEPROM cells can give rise to an undesirable memory cell state referred to as depletion or "over-erase." In such a state, the floating gate is essentially positively charged, and the memory cell functions like a depletion mode transistor. Consequently, a depleted flash EEPROM memory cell cannot be turned off with the standard control gate voltages. Fortunately, depleted flash EEPROM cells can be corrected by a soft program operation (also referred to as "repair," "heal," and "compaction"). The soft program injects a small amount of negative charge back into the floating gate, allowing the memory cell to function as an enhancement device once again. The erase process and occasional soft program process result in flash EEPROM erase operations being considerably longer than read operations.

If flash EEPROM memory cells could be maintained at all times in their established logic states (i.e., programmed or erased), the use of balanced sensing schemes within EEPROMs would not be so problematic. To illustrate this, an ideal balanced sensing EEPROM arrangement is set forth in FIG. 2A. FIG. 2A includes a sense amplifier 200 having a first input (+) and a second input (−). According to the difference in current seen at these two inputs, the sense amplifier 200 provides a DATA signal. The first input (+) is shown to be coupled to an tipper data line 202, a MUX circuit 204, and an upper array bit line 206. Two memory cells (Q200 and Q202) are shown coupled to the upper array bit line 206. The second input (−) is balanced with the first input (+), and is shown to be coupled to a lower data line 208, a MUX circuit 204, and a lower array bit line 210. Two memory cells (Q204 and Q206) are shown coupled to the tipper array bit line 206. The memory cells (Q200, Q202, Q204, and Q206) of FIG. 2A are "one transistor" (1-T) EEPROM cells.

In the particular access illustrated by FIG. 2A, it is assumed that data is read from memory cell Q202, and further, that memory cell Q202 is erased. Thus, when a high voltage is applied to the gate of memory cell Q202 (by an active word line), a current will be drawn by the memory cell (shown as Idata). At the same time, a reference current source 212 is coupled to the second input (−) of the sense amplifier. In the ideal situation, the Idata current is greater than the Iref current, and the sense amplifier 200 provides a logic "1" as an output.

FIG. 2B illustrates the same structure and access operation as FIG. 2A, but includes the non-ideal effects that arise from the presence of depleted memory cells. Accordingly, the circuit structures of FIG. 2B are referred to by the same reference characters as those in FIG. 2A. In the access operation illustrated by FIG. 2B, it is assumed that prior to the reading of data from memory cell Q202, the memory cells of the lower array (Q204 and Q206) have been subject to an erase operation. The erase operation has resulted in memory cell Q204 being placed in the depleted state. Prior to the necessary soft program operation, which would have corrected memory cell Q204, the erase operation was suspended to allow the reading of memory cell Q202 to take place.

As shown in FIG. 2B, like the access illustrated by FIG. 2A, memory cell Q2 12 is erased, and so draws a current Idata. Similarly, the reference current source 212 has been coupled to the second input (−) of the sense amplifier, resulting in the current Iref being drawn at the second input (−). However, unlike the ideal case of FIG. 2A, in FIG. 2B depleted memory cell Q204 also draws a current of its own (Idep), despite the fact that its control gate is low. Consequently, the second input (−) draws a current equal to Iref+Idep, as opposed to Iref only. This can result in the data sense operation taking too much time, or in a worst case situation, an erroneous DATA signal altogether.

In light of the potential problem presented by depleted memory cells, balanced sensing arrangements are not possible when the array providing the balanced load is being erased. This has resulted in flash EEPROMs that do not employ balanced sensing at all, and suffering in performance as a result, or flash EEPROMs that do not allow a read operation from one array while its corresponding "balancing" array is being erased. The latter approach can lead to unacceptably long read cycles as erase operations can consume considerable time.

It would be desirable to provide an EEPROM that allows balanced sensing while one of the arrays is being erased. Such an EEPROM could provide considerably more operational flexibility as well as improved speed, and data sensing performance.

SUMMARY OF THE INVENTION

According to the preferred embodiment, a balanced sensing scheme is provided for a "flash" electrically erasable programmable read-only-memory (EEPROM). For a given access operation (such as a read operation), data is coupled from a first memory bank to the first input of a sense amplifier. At the same time, a second memory bank serves as a balancing load, and is coupled to the second input of the sense amplifier. In the event the second memory bank is being erased when the access operation is to occur, to avoid the adverse effects of "depleted" memory cells within the second bank, a third alternate memory bank is coupled to the second input of the sense amplifier.

BRIEF DESCRIPTION OF THE DRAWINGS

FIGS. 1A and 1B are block schematic diagrams of a prior art balanced sensing scheme for a semiconductor memory device.

DETAILED DESCRIPTION OF THE EMBODIMENTS

The preferred embodiment is a balanced sensing scheme that may be used in a flash electrically erasable and programmable read only memory (EEPROM). The EEPROM may be a standalone device, or an "embedded" memory that is included as one portion of a larger integrated circuit device, such as a microprocessor or microcontroller. The preferred embodiment accesses memory cell banks in pairs, with one memory cell bank providing data while the other memory cell bank provides a balancing impedance. In the event the "balancing" memory cell bank is being erased, an alternate memory cell bank is utilized to provide the balancing impedance.

Figure 2A:
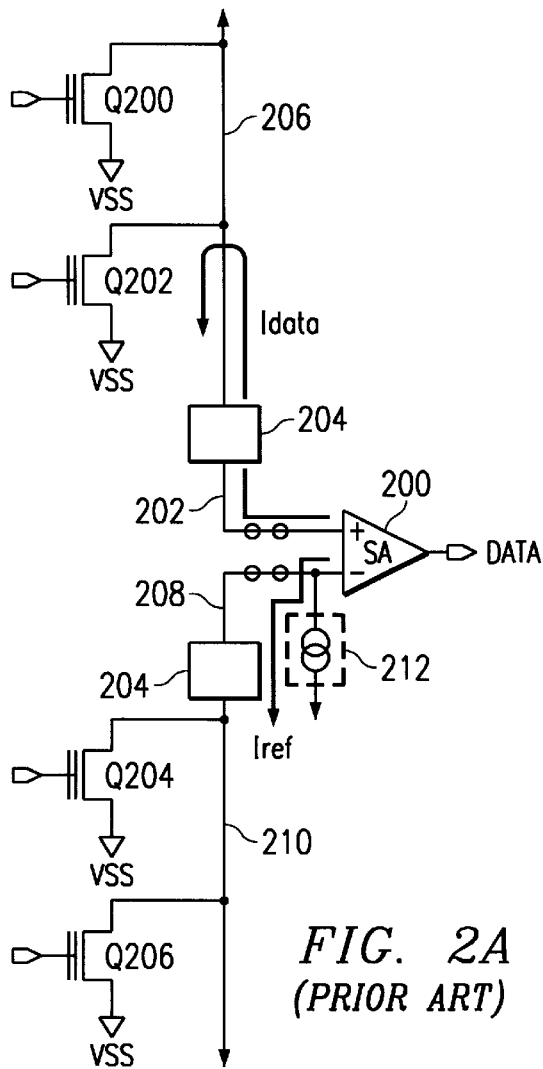
FIG. 2A is a schematic diagram illustrating a prior art EEPROM balanced sensing scheme in an ideal case.
Figure 2B:
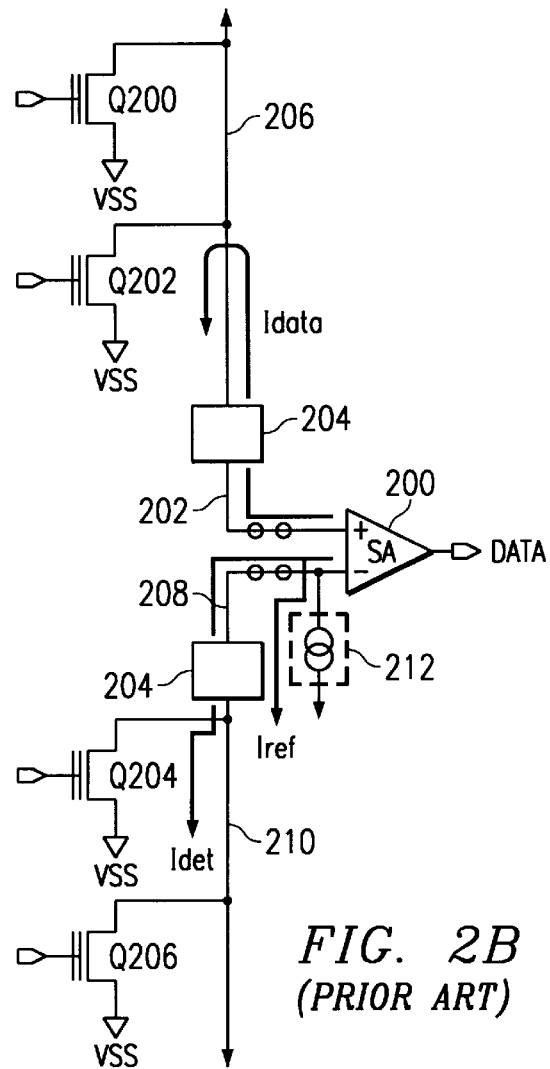
FIG. 2B is a schematic diagram illustrating the prior art EEPROM balanced sensing scheme of FIG. 2A in a non-ideal case that includes a depleted memory cell.
Figure 3:
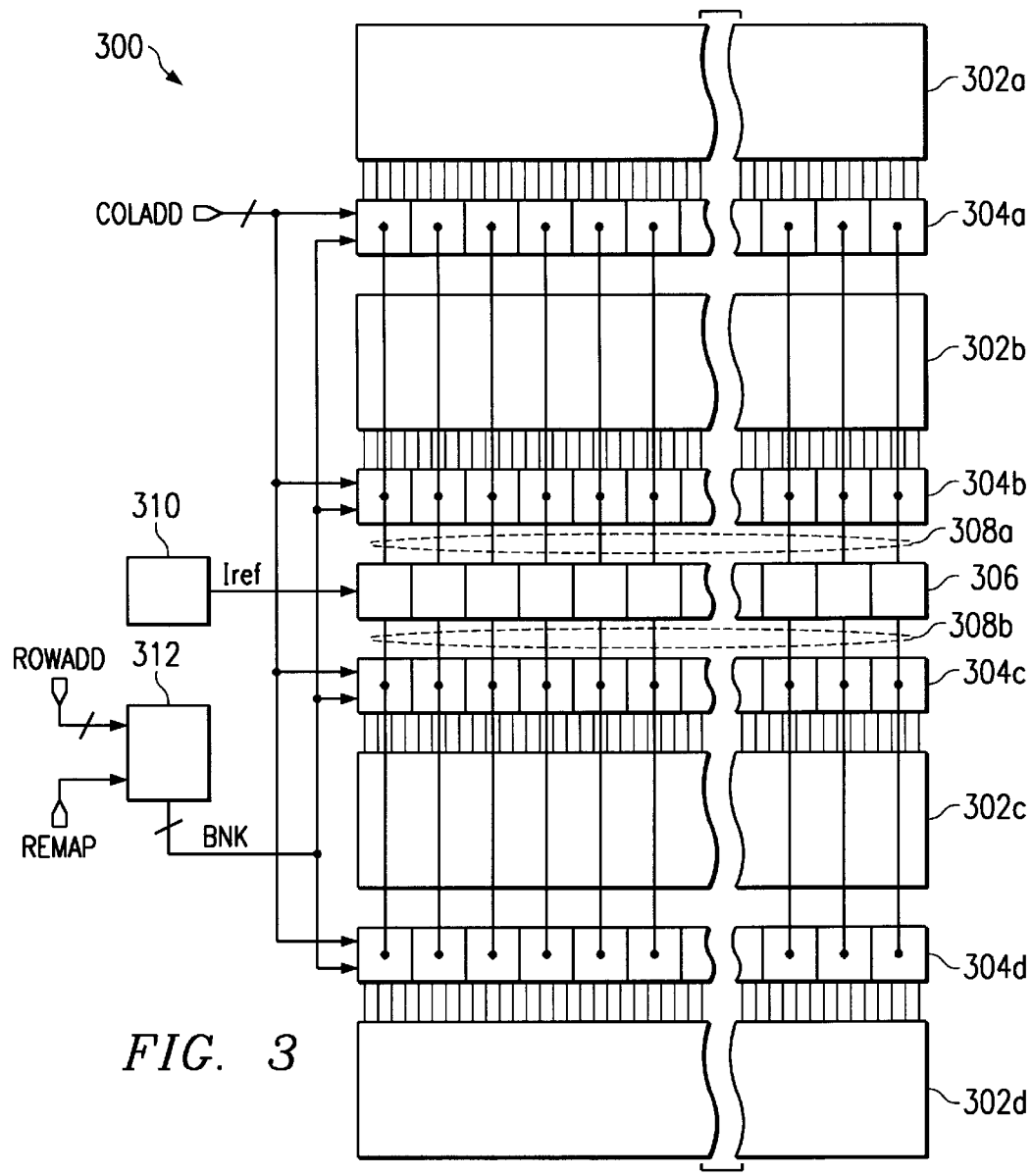
FIG. 3 is a block schematic diagram of a balanced sensing scheme according to the preferred embodiment.

Referring now to FIG. 3, the preferred embodiment is set forth in a block schematic diagram, and designated by the general reference character 300. The preferred embodiment 300 includes a number of memory cell banks 302a–302d, each coupled to a corresponding multiplexer circuit 304a–304d. Each memory cell bank (302a–302d) includes numerous memory cells arranged into rows and columns. The multiplexer circuits (304a–304d) provide access to the memory cells of their respective memory cell bank (304a–304d, respectively). For example, access to the memory cells within memory cell bank 302a is provided via multiplexer circuit 304a.

The memory cell banks (302a–302d) and multiplexer circuits (304a–304d) can be grouped according to how they are connected to a sense amplifier bank 306. In particular, in the view of FIG. 3, multiplexer circuits 304a and 304b (and thus memory cell banks 302a and 302b) are coupled to the sense amplifier bank 306 by a number of tipper data lines 308a. Thus, memory cell banks 302a and 302b can be considered "upper" memory cell banks, and multiplexer circuits 304a and 304b can be considered "upper" multiplexer circuits. In a balanced fashion, multiplexer circuits 304c and 304d are coupled to the sense amplifier bank 306 by lower data lines 308b. Thus, memory cell banks 302c and 302d can be considered "lower" memory cell banks, and multiplexer circuits 304c and 304d can be considered "lower" multiplexer circuits. It is understood that the terms "upper" and "lower" define a connection relationship to the sense amplifiers, and should not be construed as dictating a particular orientation with respect to each other.

A reference current for the sense amplifiers within the sense amplifier bank 306 is provided by a current reference circuit 310. The reference current is used to determine the logic of memory cells accessed within a memory cell bank (302a–302d).

Referring once again to FIG. 3, each multiplexer circuit (304a–304d) is shown to receive a column address (COLADD) and bank decode signals (BNK). The column address will determine which columns of an accessed memory cell bank (302a–302d) are coupled to the corresponding data lines (308a or 308b) by a multiplexer circuit (304a–304d). The bank decode signals (BNK) will enable a pair of multiplexer circuits (304a–304d) in a given access operation. The enabled pair of multiplexer circuits (304a–304d) will include one upper multiplexer circuit (304a or 304b) and one lower multiplexer circuit (304c or 304d). This arrangement results in the simultaneous access to a pair of memory cell banks, with one memory cell bank being an upper memory cell bank (302a or 302b), and the other memory cell bank being a lower memory cell bank (302c or 302d). In this manner, balanced inputs are provided to the sense amplifier bank 306.

A conventional balanced sensing approach would enable a predetermined pair of multiplexer circuits to thereby access a predetermined pair of memory cell arrays. One memory cell array would provide data, while the other would provide a balancing impedance. Thus, a conventional balanced sensing approach would activate a pair of multiplexer circuits based on an applied address. In contrast, the preferred embodiment 300 selects a pair of multiplexer circuits (304a–304d), and hence a pair of memory cell banks (302a–302d), according to an applied address and a re-mapping signal (REMAP). While the REMAP signal will not affect which memory cell bank (302a–302d) is selected as the data providing bank, it will determine which of memory cell banks (302a–302d) functions as the balancing impedance.

In the preferred embodiment 300, the REMAP signal is generated by determining the address range of any partially erased memory cell bank (302a–302d). This address range is compared to the address of the memory cell bank that is to function as a balancing load for a read operation. If there is no match, the REMAP signal will be inactive, and the read operation proceeds in a conventional manner, with a predetermined memory cell bank (302a–302d) functioning as the balanced impedance. If, however, there is a match, the REMAP signal will be active, and an alternate memory cell bank (302a–302d) will be selected as the balancing impedance.

In the particular arrangement of FIG. 3, the selection of multiplexer circuit (304a–304d) pairs is accomplished by a bank decode circuit 312 that receives the REMAP signal and a row address (ROWADD). From these inputs, the bank decode circuit 312 generates the bank signals (BNK). Thus, when the REMAP signal is inactive, an applied row address will generate a BNK signal that enables a "standard" pair of multiplexer circuits (304a–304d). One memory cell bank (304a–304d) provides data, while the other functions as the balancing load for the access operation. When the REMAP signal is active, however, an applied row address will generate BNK signals that enable an "alternate" pair of multiplexer circuits (304a–304d). This results in a change in the memory cell bank (304a–304d) that functions as the balancing impedance.

The balancing scheme is best understood with reference to FIGS. 4A–4D. FIGS. 4A–4D are block diagrams of the preferred embodiment that are simplified to more clearly illustrate the balanced sensing scheme. Each figure includes the four memory cell banks (302a–302d) and their corresponding multiplexer circuits (304a–304d). The sense amplifier bank 306 is also included in each figure. In each of the figures (FIGS. 4A–4D) the sensing operation of only a first sense amplifier 314 is set forth. Thus, only a first upper data line 316a and a first lower data line 316b are illustrated. It is understood that each access illustrated results in the remaining sense amplifiers and data lines providing the same access illustrated by the first sense amplifier 314.

Figure 4A:
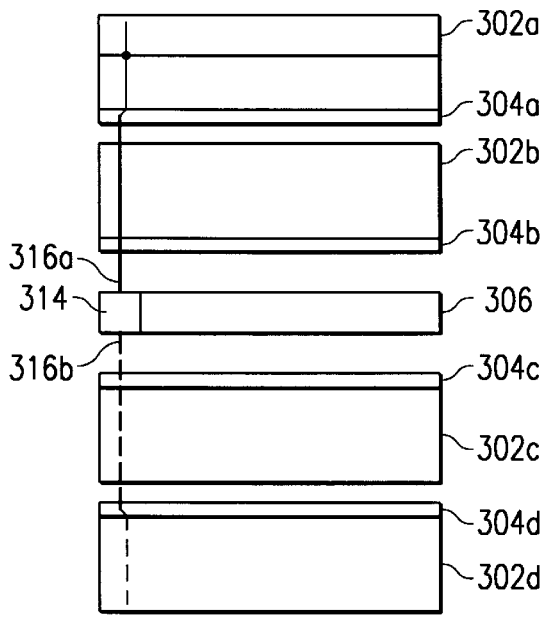
FIGS. 4A–4D are block diagrams illustrating balanced sensing operations according to the preferred embodiment.
Figure 4B:
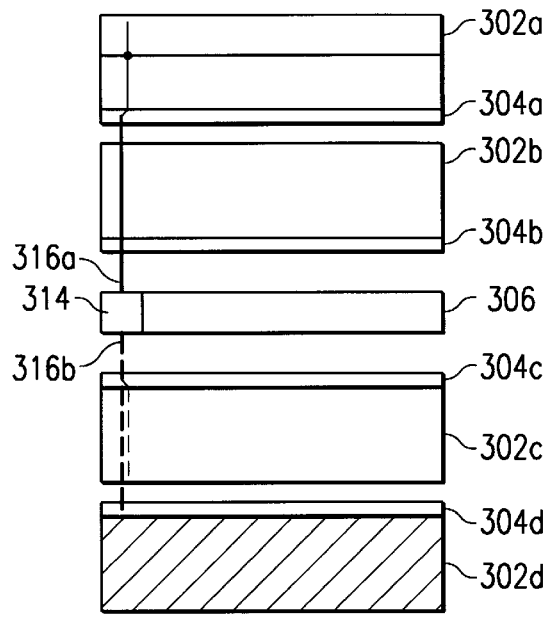

FIG. 4A illustrates a first "standard" balanced access in which data is read from upper memory cell bank 302a. It is assumed that an erase operation has not been suspended in any of the other memory cell banks (REMAP is inactive). Thus, the reading of data from upper memory cell bank 302a results in a "standard" counterpart lower memory cell bank 302d being selected to provide the balancing impedance. FIG. 4B illustrates the same access as FIG. 4B, but with an active REMAP signal. The active REMAP signal indicates that an erase operation for memory cell bank 302d has been suspended for the read operation. This is represented in FIG. 4B by the hatching of memory cell bank 302d. Because memory cell bank 302d is undergoing an erase operation, it cannot provide a balancing impedance as it may include depleted memory cells. Consequently, the resulting BNK signals result in multiplexer circuit 304c being activated instead of multiplexer circuit 304d. Thus, as shown in FIG. 4b, data is read from the same upper memory cell bank 302a, but an "alternate" counterpart lower memory cell bank 302c provides the balancing impedance in lieu of lower memory cell bank 302d.

Figure 4C:
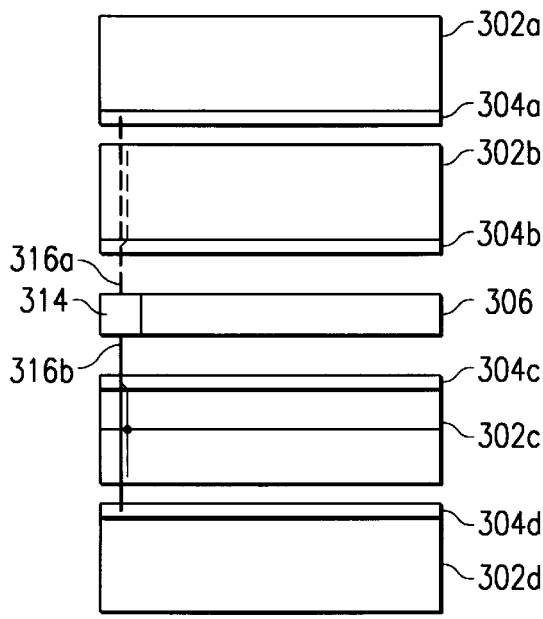
Figure 4D:
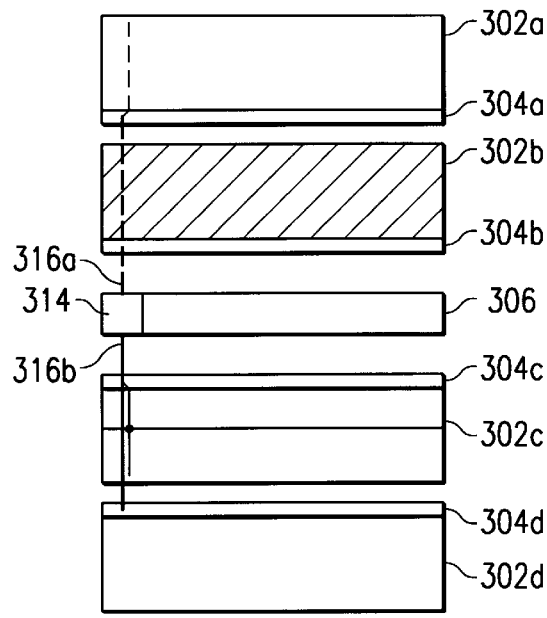

FIG. 4C illustrates a second standard balanced access in which data is read from lower memory cell bank 302c. The REMAP signal is inactive, resulting in a standard counterpart upper memory cell bank 302b being selected to provide the balancing impedance. FIG. 4D sets forth the same access as FIG. 4C, but with an active REMAP signal. An erase operation within memory cell bank 302b has been suspended. The resulting BNK signals select alternate counterpart upper memory cell bank 302a, to provide the balancing impedance in lieu of lower memory cell bank 302b.

It follows from the general description of FIGS. 4A–4B that a semiconductor memory device could include more than four banks and still benefit from the teachings set forth herein provided additional banks are added in groups of twos. A first additional bank would be coupled to the upper data lines while the second additional bank would be coupled to the lower data lines.

Figure 5:
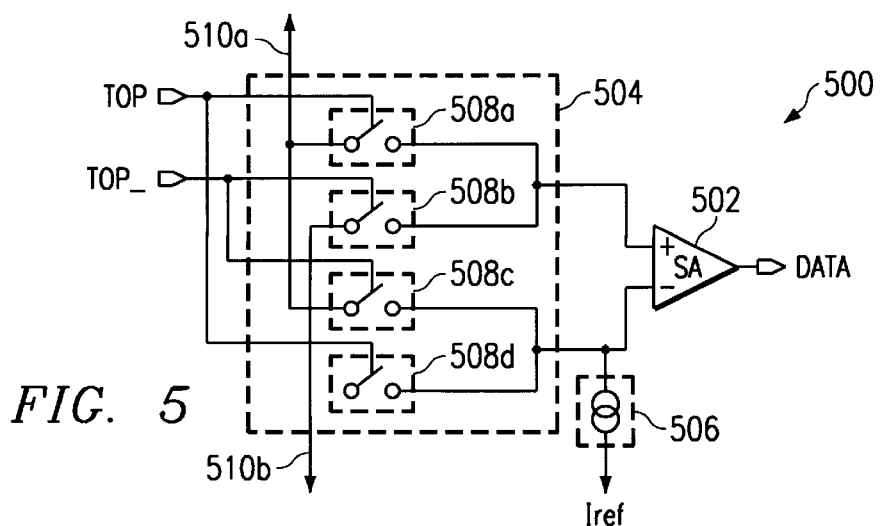
FIG. 5 is a schematic diagram of a sense amplifier arrangement of the preferred embodiment.

Referring now to FIG. 5, a sense amplifier arrangement according to a preferred embodiment is set forth in a schematic diagram. The sense amplifier arrangement is designated by the general reference character 500 and is shown to include a current sense amplifier 502 and a balanced input circuit 504. The current sense amplifier 502 includes a first input (+) that receives a data signal and a second input (−) that receives a reference signal. According to the difference in magnitude between its two inputs (+and−), the sense amplifier 502 drives an output signal (DATA) between a first and second logic level. The second input (−) is coupled to a reference current supply 506 that draws a reference current ref. In this arrangement, when the current at the first input (+) is greater than Iref, the DATA signal will be driven to a logic 1 value. When the current at the first input (+) is less than Iref, the DATA signal will have a logic 0 value.

The balanced input circuit 504 is shown to include four switching devices 508a–508d. Switching devices 508a and 508d form a first pair and switching devices 508b and 508c form a second pair. Each pair of switching devices (508a/508d and 508b/508c) couples an upper data line 510a to one input (+or−) of the sense amplifier and a lower data line 510b to the other input (−or+). In the particular arrangement of FIG. 5, the switching devices of pair 508a/508d are commonly enabled by an access signal (TOP). Conversely, the switching devices of pair 508b/508c are commonly enabled by the inverse of the access signal (TOP_).

A high TOP signal (and low TOP_ signal) indicates that data is to be accessed via the upper data line 510a, and the lower data line 510b is to function as a balancing impedance. Thus, when the TOP signal is high, switching device 508a will be on (closed), coupling a data signal, via upper data line 510a to the first sense amplifier input (+). At the same time, switching device 508d is also on, coupling the lower data line 510b to the second sense amplifier input (−). The reference current supply 306 will thus be present on the balanced impedance. Because the TOP_ signal is low, switching devices 508b and 508c are turned off. A low TOP signal (and high TOP_ signal) indicates that data is to be accessed via the lower data line 510b. In this situation, the upper data line 510a must function as a balancing impedance. When the TOP signal is low, switching devices 508a and 508d are turned off, and switching devices 508b and 508c are turned on. As a result, the lower data line 510b is coupled to the first sense amplifier input (+) to provide a data signal thereto. The upper data line 510a is coupled to the second input (−) of the sense amplifier 502.

Although the present invention has been described in detail, it should be understood that various changes, substitutions, and alterations could be made without departing from the spirit and scope of the invention as defined by the appended claims.

What is claimed is:

1. A semiconductor memory device, comprising:
   a plurality of sense amplifiers, each sense amplifier including a first input and a second input;
   a plurality of first data lines, at least one first data line corresponding to each sense amplifier;
   a plurality of second data lines, at least one second data line corresponding to each sense amplifier;
   a balanced input circuit corresponding to each sense amplifier, each balanced input circuit
      providing a low impedance path between one of the first data lines and the first input of its corresponding sense amplifier and one of the second data lines and the second input of its corresponding sense amplifier, or
      providing a low impedance path between the one second data line and the first input of its corresponding sense amplifier and the one first data line and the second input of its corresponding sense amplifier;
   a plurality of memory cells arranged into a number of memory cell banks, each memory cell bank including a number of memory cells accessed by a read operation and having at least two logic states, the logic states of memory cells being alterable by a data change operation, the data change operation taking longer than a read operation;
   a first multiplexer circuit coupling a first of the memory cell banks to the first data lines;
   a second multiplexer circuit coupling a second of the memory cell banks to the first data lines;
   a third multiplexer circuit coupling a third of the memory cell banks to the second data lines; and
   a fourth multiplexer circuit coupling a fourth of the memory cell banks to the second data lines.

2. The semiconductor memory device of claim 1, wherein:
   each memory cell, when accessed by a read operation, provides a current signal that indicates its logic state; and
   the second sense amplifier input of each sense amplifier is further coupled to a current source that provides a reference current.

3. The semiconductor memory device of claim 1, wherein:
   each balanced input circuit includes
      a first switching device coupled between a first data line and the first input of its corresponding sense amplifier,
      a second switching device coupled between the first data line and the second input of its corresponding sense amplifier,
      a third switching device coupled between a second data line and the first input of its corresponding sense amplifier, and
      a fourth switching device coupled between the second data line and the second input of its corresponding sense amplifier.

4. The semiconductor memory device of claim 1, wherein:
   the memory cells are electrically erasable programmable read only memory (EEPROM) cells having at least one programmed logic state and an erased logic state, the EEPROM cells being placed in the erased logic state by an erase operation that takes longer than a read operation.

5. The semiconductor memory device of claim 1, wherein:
   the sense amplifiers are arranged into a sense amplifier bank, the first data lines being disposed on a first side of the sense amplifier bank, the second data lines being disposed on a second side of the sense amplifier bank.

6. The semiconductor memory device of claim 5, wherein:
   a first memory cell bank and a second memory cell bank are disposed on the first side of the sense amplifier bank; and
   a third memory cell bank and a fourth memory cell bank are disposed on the second side of the sense amplifier bank.

7. In a semiconductor memory device having a plurality of current sense amplifiers, a balanced sensing scheme, comprising:

a plurality of memory cells arranged into banks of rows and columns, each memory cell drawing more than a predetermined current in a first logic state and less than a predetermined current in a second logic state, the banks including first side banks and second side banks;

a multiplexer circuit associated with each one of the banks, each multiplexer circuit providing access to its associated bank according to an applied address and a remap indication, each applied address resulting in one of the first side banks and a corresponding second side bank being accessed when the remap indication is inactive, a first of the two accessed banks providing data while a second of the two accessed banks provides a balancing load, and each applied address resulting in a bank other than the second of the two accessed banks providing a balancing load when the remap indication is active;

a plurality of first data lines coupled to the multiplexer circuits associated with the first side banks; and a plurality of second data lines coupled to the multiplexer circuits associated with the second side banks.

8. The balanced sensing scheme of claim 7, wherein:

the memory cells are electrically erasable programmable read only memory (EEPROM) cells that are erased in groups; and the remap indication is activated when a group of memory cells are being erased and the applied address corresponds to the array containing the group of memory cells being erased.

9. The balanced sensing scheme of claim 7, wherein:

each bank includes bit lines coupled to the memory cells in a like column; and each multiplexer circuit couples its associated data lines to selected bit lines of its associated bank.

10. The balanced sensing scheme of claim 7, wherein:

each memory cell is a one-transistor (1-T) EEPROM cell.

11. The balanced sensing scheme of claim 7, wherein:

the applied address includes a first portion and a second portion, the first portion determining which of the two accessed banks provides data, the second portion determining which column is accessed in the data providing bank.

12. The balanced sensing scheme of claim 7, wherein:

when one of the first side banks provides data, one of the second side banks provides the corresponding balancing load; and when one of the second side banks provides the data signal, one of the first side banks provides the corresponding balancing load.

13. The balanced sensing scheme of claim 7, further including:

a plurality of sense amplifier arranged in a bank, each sense amplifier having a first input and a second input;

the first data lines being further coupled to the first inputs of the sense amplifiers; and the second data lines being further coupled to the second inputs of the sense amplifiers.

14. In an electrically erasable and programmable read only memory (EEPROM) having a group erase operation, an architecture that allows balanced sensing of data signals, the architecture comprising:

a plurality of memory cell banks, each containing a plurality of memory cells, the memory cell banks being logically arranged into a number of memory cell bank pairs, each memory cell bank pair including an upper memory cell bank and a lower memory cell bank;

a plurality of upper data lines;

a plurality of lower data lines, each lower data line corresponding to an upper data line;

a plurality of sense amplifiers, each sense amplifier being coupled between one of the upper data lines and its corresponding lower data line; a plurality of multiplexer circuit pairs, each multiplexer circuit pair corresponding to one of the memory cell bank pairs and including an upper multiplexer circuit that couples its corresponding upper memory cell bank to the upper data lines when enabled, a lower multiplexer circuit that couples its corresponding lower memory cell bank to the lower data lines when enabled, each lower multiplexer circuit being enabled when its corresponding upper multiplexer circuit is enabled and the memory cells of its corresponding lower memory cell bank are not being group erased;

an alternative lower multiplexer circuit of a different multiplexer circuit pair being enabled when an upper multiplexer circuit is enabled, and the memory cell bank of its corresponding lower multiplexer circuit is undergoing a group erase operation.

15. The EEPROM architecture of claim 14, wherein:

the memory cells of each lower memory cell bank can be simultaneously erased.

16. The EEPROM architecture of claim 15, wherein:

each sense amplifier includes a lower access configuration in which the data input is coupled to a lower data line and the reference input is coupled to an upper data line, and an upper access configuration in which the data input is coupled to the upper data line and the reference input is coupled to the lower data line.

17. The EEPROM architecture of claim 15, wherein:

each sense amplifier includes its reference input being coupled to a reference current source.

18. The EEPROM architecture of claim 14, wherein:

the memory cells are one transistor EEPROM memory cells having established values that include a programmed state and an erased state.

19. The EEPROM architecture of claim 14, wherein:

each sense amplifier is a current sense amplifier having a reference input and a data input.

20. The EEPROM architecture of claim 14, wherein:

each memory cell bank includes a plurality of bit lines, each bit line being coupled to a number of memory cells;

each upper multiplexer circuit couples the upper data lines to selected bit lines of its corresponding upper memory cell bank, when enabled; and each lower multiplexer circuit couples the lower data lines to selected bit lines of its corresponding lower memory cell bank, when enabled.

* * * * *